(12) United States Patent
Yuan

(10) Patent No.: US 9,640,425 B2
(45) Date of Patent: May 2, 2017

(54) SYSTEM FOR MAKING AND CLEANING SEMICONDUCTOR DEVICE

(71) Applicant: Semiconductor Manufacturing International Corp, Shanghai (CN)

(72) Inventor: Zhugen Yuan, Shanghai (CN)

(73) Assignee: SEMICONDUCTOR MANUFACTURING INTERNATIONAL CORP., Shanghai (CN)

(*) Notice: Subject to any disclaimer, the term of this patent is extended or adjusted under 35 U.S.C. 154(b) by 43 days.

(21) Appl. No.: 14/166,981

(22) Filed: Jan. 29, 2014

(65) Prior Publication Data

US 2014/0144474 A1 May 29, 2014

Related U.S. Application Data

(62) Division of application No. 13/726,672, filed on Dec. 26, 2012, now Pat. No. 8,673,764.

(30) Foreign Application Priority Data

Oct. 16, 2012 (CN) .......................... 2012 1 0393608

(51) Int. Cl.
   *B08B 3/00* (2006.01)
   *H01L 21/768* (2006.01)
   *H01L 21/02* (2006.01)

(52) U.S. Cl.
   CPC .. *H01L 21/76814* (2013.01); *H01L 21/02063* (2013.01)

(58) Field of Classification Search
   None
   See application file for complete search history.

(56) References Cited

U.S. PATENT DOCUMENTS 5,361,787 A * 11/1994 Miyazaki ................. B08B 3/04
                                                    134/104.2
6,253,775 B1 * 7/2001 Kitahara et al. ............. 134/108
                           (Continued)

FOREIGN PATENT DOCUMENTS

CN    101996924 A    3/2011
JP    2001129302 A *  5/2001  ............... B01D 5/00

OTHER PUBLICATIONS

English machine translation of JP 2001129302 A.*
(Continued)

*Primary Examiner* — Michael Barr
*Assistant Examiner* — Jason Riggleman
(74) *Attorney, Agent, or Firm* — Anova Law Group, PLLC

(57) ABSTRACT

Various embodiments provide methods and systems for making and/or cleaning semiconductor devices. In one embodiment, a semiconductor device can be formed including a metal layer and a photoresist polymer. During formation, the semiconductor device can be cleaned in a cleaning chamber by a first cleaning solution provided from a solution supply device. After this cleaning process, a second cleaning solution containing metal ions and/or polymer residues can be produced and processed in a solution processing device to at least partially remove the metal ions and/or polymer residues to produce a third cleaning solution for re-use. In an exemplary fabrication or cleaning system, the solution processing device may be configured connecting to either an inlet or an outlet of the cleaning chamber. After cleaning, the semiconductor device can be processed to include a metal plug or an interconnect wiring.

11 Claims, 4 Drawing Sheets

(56) References Cited

U.S. PATENT DOCUMENTS

2007/0007196 A1* 1/2007 Komatsu et al. .......... 210/500.1
2010/0126934 A1* 5/2010 Nakazato et al. ............ 210/638

OTHER PUBLICATIONS

Worawan Kay Maketon and Kimberly L. Ogden "Treatment of Copper from Cu CMP Waste Streams Using Polyethyleneimine" IEEE Transactions on Semiconductor Manufacturing, vol. 21, No. 3, pp. 481-184, Aug. 2008.

* cited by examiner

SYSTEM FOR MAKING AND CLEANING SEMICONDUCTOR DEVICE

CROSS REFERENCE TO RELATED APPLICATIONS

This application is a divisional of U.S. patent application Ser. No. 131726,672, filed on Dec. 26, 2012, which claims priority to Chinese Patent Application No. 201210393608.6, filed on Oct. 16, 2012, the entire contents of all of which are incorporated herein by reference.

FIELD OF THE DISCLOSURE

The present disclosure relates to the field of semiconductor technology and, more particularly, relates to methods and systems for making and/or cleaning semiconductor devices.

BACKGROUND

With development of semiconductor integrated circuit (IC) technology, semiconductor devices and interconnect structures are downsized. Such downsizing may result in reduced spacing between metal wirings and also result in reduced thickness of inter-layer dielectric (ILD) layers for isolating adjacent metal wirings. Consequently, crosstalk may occur between the metal wirings. Conventional methods for effectively reducing such crosstalk may include reducing dielectric constant (k) of the ILD layers, i.e., using low-k ILD layers, configured between metal wirings. The low-k ILD layers may also effectively reduce resistance capacitance delay (RC delay) between the metal wirings. For these reasons, low-k and ultra-low-k dielectric materials have been widely used for ILD layers in the interconnect technology. Since air provides minimum k value (k=1.0) among other materials that can be obtained, forming air pores, gaps, or holes in the ILD layers can effectively reduce the k value of the dielectric material. That is, ILD layers formed by porous materials have reduced k value.

In addition, copper interconnect structure is widely used in IC devices. This is because signal transmission between semiconductor devices requires high density of interconnect wirings, and interconnect wirings formed by copper production process can reduce RC delay and improve reliability issues caused by electron migration.

Conventional methods for forming a copper interconnect structure include forming grooves or through holes in a porous ILD layer to form interconnect metal wirings or metal plugs, which requires forming photoresist pattern on the ILD layer. After the grooves or through holes are formed, the photoresist pattern is removed by an ashing method. After removing the photoresist pattern, polymer residues are left in the grooves or through holes, which affects properties of the formed semiconductor device. Before filling copper in these grooves or through holes, a cleaning solution (e.g., EKC solution from DuPont or ST250 solution from ATMI) is needed to wet clean the semiconductor device to remove the polymer residues.

Cleaning solutions are often repeatedly used to reduce cleaning and manufacturing cost. In order to ensure the cleaning effect, after each use, the cleaning solution may be filtered to remove the polymer residues. However, semiconductor devices cleaned in such cleaning solutions may be prone to having time dependent dielectric breakdown (TDDB), which adversely affects device reliability.

Thus, there is a need to provide improved methods and systems for making and/or cleaning semiconductor devices.

BRIEF SUMMARY OF THE DISCLOSURE

According to various embodiments, there is provided a method of making a semiconductor device. To make the semiconductor device, a semiconductor substrate including a metal layer can be provided. An inter-layer dielectric (ILD) layer can be formed on the semiconductor substrate. The ILD layer can be porous. A photoresist pattern can be used to form a through hole in the ILD layer to expose at least a portion of the metal layer in the semiconductor substrate. The through hole can be cleaned using a first cleaning solution to produce a second cleaning solution containing one or more of metal ions and polymer residues. The one or more of the metal ions and the polymer residues can then be removed from the second cleaning solution. The through hole can be filled with a metal to form a metal plug or an interconnect wiring.

According to various embodiments, there is also provided a method of cleaning a semiconductor device. In this method, the semiconductor device can be provided to include a semiconductor substrate that includes a copper metal layer, and an inter-layer dielectric (ILD) layer formed of a porous material and disposed on the semiconductor substrate. The ILD layer can include a through hole or a groove configured to expose at least a portion of the metal layer. The through hole or the groove can include photoresist polymer residues. A first cleaning solution can be used to remove the photoresist polymer residues from the semiconductor device to produce a second cleaning solution containing one or more of copper ions and polymer residues including the photoresist polymer residues. The one or more of the copper ions and the polymer residues can be removed from the second cleaning solution to produce a third cleaning solution, which is re-used in a subsequent cleaning process.

According to various embodiments, there is further provided a system for cleaning a semiconductor device. The system can include a solution supply device configured to supply a first cleaning solution, and a cleaning chamber connecting to the solution supply device to receive the first cleaning solution configured to clean the semiconductor device placed in the cleaning chamber and produce a second cleaning solution. The semiconductor device can include a copper metal layer and a photoresist polymer, and the second cleaning solution can be configured to flow back to the solution supply device. The system can also include a solution processing device configured connecting to the cleaning chamber such that the second cleaning solution is processed in the solution processing device to remove one or more of copper ions and polymer residues from the second cleaning solution to produce a third cleaning solution for re-use.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

As previously mentioned, when low-k or ultra-low-k porous materials are used to make an inter-layer dielectric (ILD) layer and copper is used for interconnect wirings or metal plugs, the resultant semiconductor device can have poor TDDB properties. This is because the porous ILD layer may contain copper ions. Specifically, because of high activity of copper ions, when using a cleaning solution to remove polymer residues left on bottom and sidewall surfaces of the through hole, the cleaning solution may react with (e.g., corrode) the exposed metal (e.g., copper) and thus contain metal ions. Metal ions cannot be removed from the cleaning solution even by filtering the cleaning solution when attempting to remove polymer residues. Thus, the more times the cleaning solution is repeatedly used, the more amount of metal ions is contained in the cleaning solution. For example, when about 72 wafers of semiconductor devices are cleaned, copper ions can have a concentration of about 187.8 ppb in the cleaning solution. In addition, because the ILD layer is made of low-k or ultra-low-k porous materials, which traps (e.g., absorbs or adsorbs) metal ions from the cleaning solution having high concentration of metal ions. The performance of the ILD layer is then adversely affected, leading to TDDB performance deterioration and impacting the reliability of the semiconductor device.

As disclosed herein, improved methods and systems for fabricating and/or cleaning a semiconductor device are provided. After cleaning through holes using a cleaning solution, the metal ions and/or the polymer residues in the cleaning solution can be treated and at least partially removed as desired from the cleaning solution such that the treated cleaning solution has less or no metal ions and is ready for re-use. When this treated cleaning solution is re-used (e.g., to clean the same or different semiconductor device), even though the treated cleaning solution may react with the metal layer exposed from the semiconductor device, and the cleaning solution may still only contain metal ions with acceptable small amount. With this small amount, it is difficult for the ILD layer to absorb or capture metal ions from the re-used cleaning solution. In case some metal ions are still absorbed by the ILD layer, the absorbed metal ions (e.g., copper ions) may be in even smaller amount, and the effect of this small amount of the metal ions absorbed by the ILD layer may be negligible. Thus, the desired TDDB properties and reliability of the final semiconductor device can be achieved.

Figure 1:
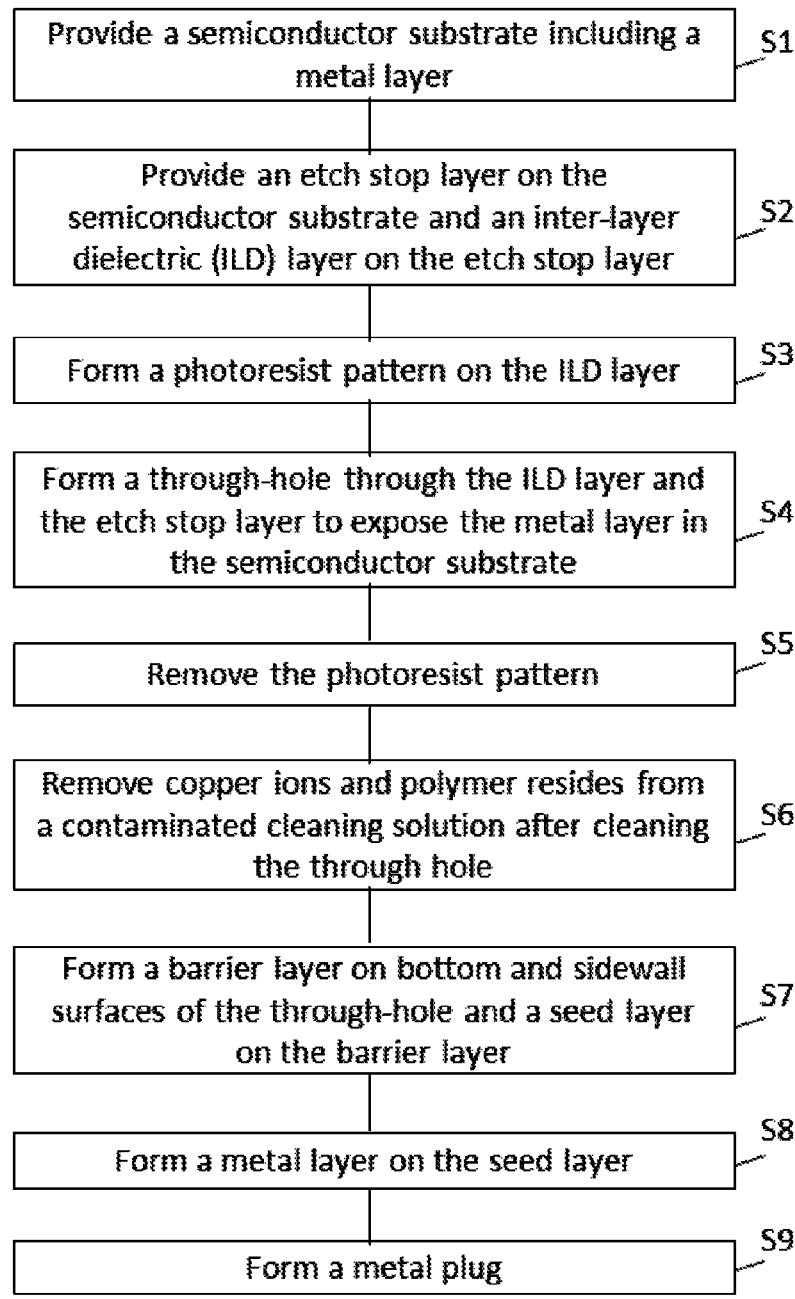
FIG. 1 depicts an exemplary method of making a semiconductor device in accordance with various disclosed embodiments.

FIG. 1 depicts an exemplary method of making a semiconductor device. According to FIG. 1, FIG. 2 is a schematic view of the semiconductor device structure prior to etching an ILD layer, and FIG. 3 is a schematic view of the semiconductor device structure after the etching of the ILD layer.

Figure 2:
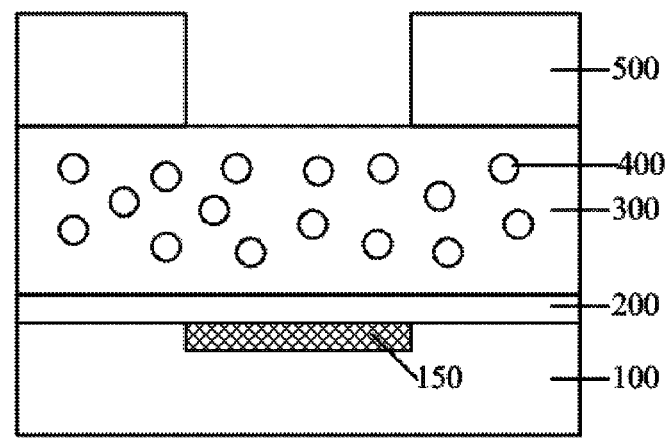
FIG. 2 depicts an exemplary semiconductor device structure prior to etching an inter-layer dielectric (ILD) layer in accordance with various disclosed embodiments.
Figure 3:
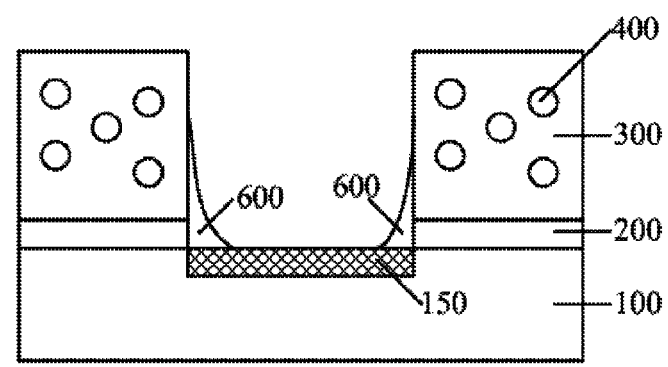
FIG. 3 depicts an exemplary semiconductor device structure after etching the ILD layer in accordance with various disclosed embodiments.

At step S1 in FIG. 1 and referring to FIG. 2, a semiconductor substrate 100 can be provided. The semiconductor substrate 100 can include one or more metal layers 150, for example, copper metal layers, in the semiconductor substrate.

The semiconductor substrate 100 can be single crystal silicon, single crystal silicon germanium, single crystal carbon-doped silicon, and/or any suitable materials without limitation. The semiconductor substrate 100 may further include suitable devices (not shown) or semiconductor structures (not shown), for example, a semiconductor structure formed in a front process for forming, e.g., MOS transistors, etc.

The semiconductor substrate 100 may include at least a portion of interconnect structures, e.g., the metal layer 150. The metal layers 150 located in the semiconductor substrate 100 may be exposed and may include interconnect wirings and/or metal plugs.

Optionally, an etch stop layer 200 can be formed on the semiconductor substrate 100. The etch stop layer 200 can be used to prevent material diffusion from the metal layer 150. In one embodiment, the etch stop layer 200 can be made of silicon nitride and formed by chemical vapor deposition.

At step S2 in FIG. 1 and still in FIG. 2, an inter-layer dielectric (ILD) layer 300 can be formed on the etch stop layer 200 that is on the semiconductor substrate 100. The ILD layer 300 can be used to insulate adjacent interconnect structures to reduce RC delay of the formed semiconductor device.

The ILD layer 300 can be made of a low-k dielectric material, e.g., having a dielectric constant ranging from about 3.9 to about 2.8. Non-limited examples of the low-k dielectric material can be $SiO_2$, SiOF, SiCOH, SiO, SiCO, SiCON, or any combinations thereof. The ILD layer 300 can be made of an ultra-low-k dielectric material, e.g., having a dielectric constant ranging from about 2.2 to about 2.8, such as a black diamond (BD), etc.

The ILD layer 300 can be formed, e.g., by chemical vapor deposition. To further reduce dielectric constant of the ILD layer 300, the ILD layer 300 can be made porous, for example, by a UV (i.e., ultraviolet) process to form gaps or pores 400 within the ILD layer 300.

In various embodiments, the porous ILD layer 300 can be formed by a process including, for example, spin-on deposition (SOD) to form porous $SiO_2$ layer or a porous polymer layer, electron cyclotron resonance (ECR) plasma to form SiCOH films, plasma enhanced chemical vapor deposition (PECVD) to form silicon-based porous film, and/or any suitable processes. In some embodiments, the ILD layer 300 can be formed directly on the semiconductor substrate 100 and the etch stop layer 200 can be omitted.

At step S3 in FIG. 1 and still referring to FIG. 2, a photoresist pattern 500 can be formed on the ILD layer 300. The photoresist pattern 500 can have a pattern corresponding to the subsequently-formed through hole.

At step S4 in FIG. 1 and referring to FIG. 3, the photoresist pattern 500 can be used as a mask to etch the ILD layer 300 and the optional etch stop layer 200 to expose a surface portion of the metal layer 150 and form a through hole. The etching process can include a dry etching or wet etching to form the through hole. When etching the ILD layer 300 and the etch stop layer 200, polymer residues 600 can be produced by the etchant and the etched material. In one example, the polymer residues can include photoresist polymer residues. The polymer residues 600 can be left on the bottom and sidewall surfaces of the etched through hole.

In other embodiments, a hard mask layer (not shown) can be formed on the ILD layer 300, and the photoresist pattern 500 can be formed on the hard mask layer. Accordingly, the photoresist pattern 500 can be used as a mask to etch the hard mask layer, and then etch the ILD layer 300 and the optional etch stop layer 200.

Note that although FIG. 3 illustrates a through hole formed in the ILD layer 300, one of ordinary skill in the art would understand that other like structures such as, for example, a groove, a via, and/or a trench can be formed in the ILD layer and positioned corresponding to the metal layer in the semiconductor substrate in accordance with various embodiments.

At step S5 in FIG. 1 and referring to FIG. 3, the photoresist pattern 500 can be removed, for example, by an ashing process or other suitable process. After removing the photoresist pattern 500, more polymer residues 600 may be produced and accumulated on the bottom and sidewall surfaces of the through hole.

To prevent adverse effect of the polymer residues 600 on the subsequent formation and final performance of the device, the polymer residues 600 can be removed before any subsequent fabrication processes. Suitable cleaning solutions can include wet cleaning chemicals that can be employed to remove the polymer residues 600 including, for example, an EKC solution (e.g., produced by DuPont, Wilmington, Del., U.S.), an ST250 solution (e.g., produced by ATMI, Danbury, Conn., U.S.), and/or any other suitable cleaning solutions.

When polymer residues are removed by a cleaning solution, metal materials, e.g., copper ions, are also washed from the metal layer into the cleaning solution, which may adversely affect manufacturing and functioning of the final device. As disclosed herein, the metal materials (e.g., copper ions, which hereinafter are used as an example for illustration purposes) can be removed from the cleaning solution such that the cleaning solution can be repeatedly used without affecting the manufacturing and functioning of the final IC device.

At step S6 in FIG. 1, after cleaning the through hole by the cleaning solution (i.e., a first cleaning solution), a second cleaning solution, e.g., a contaminated cleaning solution, including copper ions and/or polymer residues can be produced. The contaminated cleaning solution can then be processed or treated to remove copper ions and/or polymer residues there-from to form a third cleaning solution, e.g., a treated cleaning solution, which is ready for re-use.

In various embodiments, the copper ions and the polymer residues can be removed simultaneously or sequentially. For example, the copper ions can be removed first, followed by removal of the polymer residues, or vice versa. Any suitable methods for removing copper ions and polymer residues, e.g., in a same or different process, can also be encompassed herein.

In one embodiment, the copper ions may be removed by using an ion exchange method. Specifically, the ion exchange method can use an ion exchange resin to replace copper ions in the contaminated cleaning solution. Alternatively, the copper ions can be removed by an absorption (or adsorption, which is interchangeably used herein with the term absorption) method. Specifically, this method can use an ion absorbent including, for example, polyethylene imine (PEI), activated carbon, bacterial cell, and/or any combination thereof, to absorb the exemplary copper ions from the contaminated cleaning solution.

The treated cleaning solution can be repeatedly used to clean the semiconductor device without adversely affecting the TDDB properties of the semiconductor device.

Figure 4:
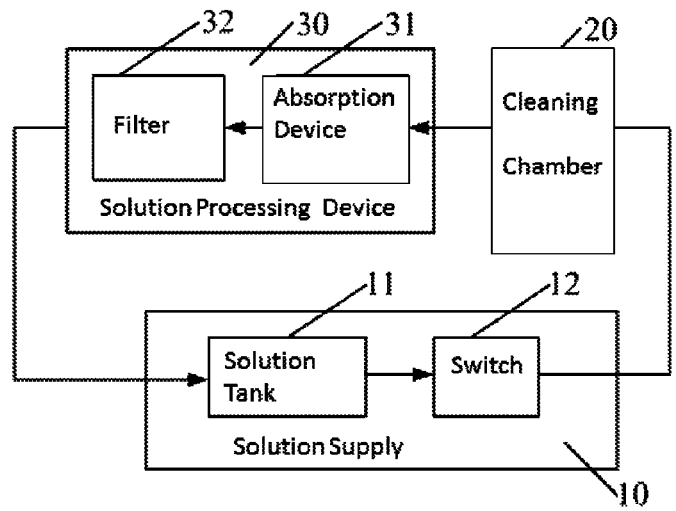
FIG. 4 depicts an exemplary cleaning system in accordance with various disclosed embodiments.

FIG. 4 depicts an exemplary cleaning system in accordance with various disclosed embodiments. The cleaning system can use a cleaning solution to remove the polymer residues 600 as shown in FIG. 3, turning the cleaning solution into a contaminated cleaning solution, and then remove copper ions and/or the polymer residues from the contaminated cleaning solution.

As shown in FIG. 4, the cleaning system can include, for example, a solution supply device 10, a cleaning chamber 20, and/or a solution processing device 30. Certain component(s) may be omitted and other component(s) may be added.

The solution supply device 10 can be used for storing and supplying suitable cleaning solutions. For example, the solution supply device 10 can include a solution tank 11 for storing the cleaning solution, a switch 12 connecting to the outlet of the solution tank 11 for controlling the outflow of the cleaning solutions. The solution tank 11 can be, for example, a chemical storing tank for recirculated processes.

The cleaning chamber 20 can include an inlet for receiving cleaning solutions to clean a semiconductor device (e.g., having a metal layer and a photoresist layer or pattern) placed in the cleaning chamber 20. Polymer residues can then be removed from the semiconductor device into the cleaning solution, forming a contaminated cleaning solution. The cleaning chamber 20 can include an outlet to exit the contaminated cleaning solution.

The solution processing device 30 can couple the outlet of the cleaning chamber 20, for receiving the contaminated cleaning solutions, to the solution supply device 10. The solution processing device 30 can be used to process the contaminated cleaning solutions, e.g., to remove the copper ions and/or the polymer residues. In one embodiment, the solution processing device 30 can include an absorption (or adsorption) device 31 for absorbing copper ions from the contaminated cleaning solution. The solution processing device 30 can further include a filter 32 connecting the absorption device 31 to the solution tank 11. The filter 32 can be used to filter out polymer residues from the processed cleaning solution, which has been processed by the absorption device 31. A treated cleaning solution can then be provided back to the solution tank 11 and/or stored in the solution tank 11. The treated cleaning solution can be repeatedly used or re-used.

In this manner, copper ions can be absorbed and removed by the absorption device 31, which may include, but not be limited to, polyethylene imine, activated carbon, and/or bacterial cell. Polymer residues can be filtered out and removed by the filter 32, which may include, but not be limited to, activated carbon.

In various embodiments, the solution supply device 10 may further include a pump (not shown) to facilitate introduction of cleaning solutions into the cleaning chamber 20.

In other embodiments, the contaminated cleaning solution can be processed or treated before being re-used in the cleaning chamber (instead of being treated after being used in the cleaning chamber as shown in FIG. 4). For example, the solution processing device 30 can be provided between the solution supply device 10 containing contaminated cleaning solution (e.g., from previous cleaning process) and the inlet of the cleaning chamber 20 having the semiconductor device to be cleaned therein. The solution processing device 30 can thus treat the contaminated cleaning solution to remove copper ions and/or polymer residues and to ensure that the treated cleaning solution flows into the cleaning chamber 20 to clean the semiconductor device placed therein.

Figure 5:
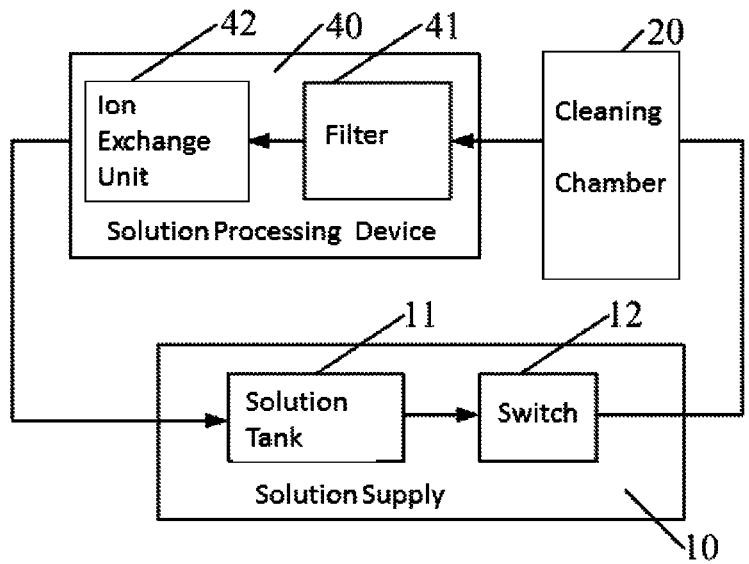
FIG. 5 depicts another exemplary cleaning system in accordance with various disclosed embodiments.

FIG. 5 depicts another exemplary cleaning system in accordance with various disclosed embodiments. The contaminated cleaning solution can be processed or treated to first remove polymer residues and then remove copper ions. Compared with the exemplary cleaning system as depicted in FIG. 4 having the solution processing device 30, the exemplary cleaning system of FIG. 5 can have an alternative solution processing device 40 including a filter 41 connected to the outlet of the cleaning chamber 20 to first filter out and remove polymer residues from the contaminated cleaning solution, after the cleaning of semiconductor devices placed in the cleaning chamber 20.

The solution processing device 40 can include an ion exchange unit 42 connecting the filter 41 to the solution tank 11. The ion exchange unit 42 can be used to remove copper ions from the contaminated cleaning solution through an ion exchange process. The treated cleaning solution can then flow back into the solution tank 11 and can be re-used.

In various embodiments, the absorption device 31 and the filter 32 shown in FIG. 4 can be integrated into one single device. Likewise, the filter 41 and the ion exchange unit 42 shown in FIG. 5 can be integrated into one single device.

In various embodiments, the ion exchange unit 42 can be added into or used to replace the absorption device 31 in the cleaning system shown in FIG. 4, while the adsorption device 31 can be added into used to replace the ion exchange unit 42 in the cleaning system shown in FIG. 5.

In this manner, the cleaning systems shown in FIG. 4 and/or FIG. 5 can remove copper ions and/or polymer residues from the contaminated cleaning solution after removal of, e.g., the polymer residues 600 as shown in FIG. 3. That is, copper ions in the recirculated process depicted in FIGS. 4-5 can be removed from the recirculation line. This removal can decrease or eliminate the amount of copper ions trapped in the porous low-K or ultra-low-k ILD layer. Device TDDB performance can be improved.

Figure 6:
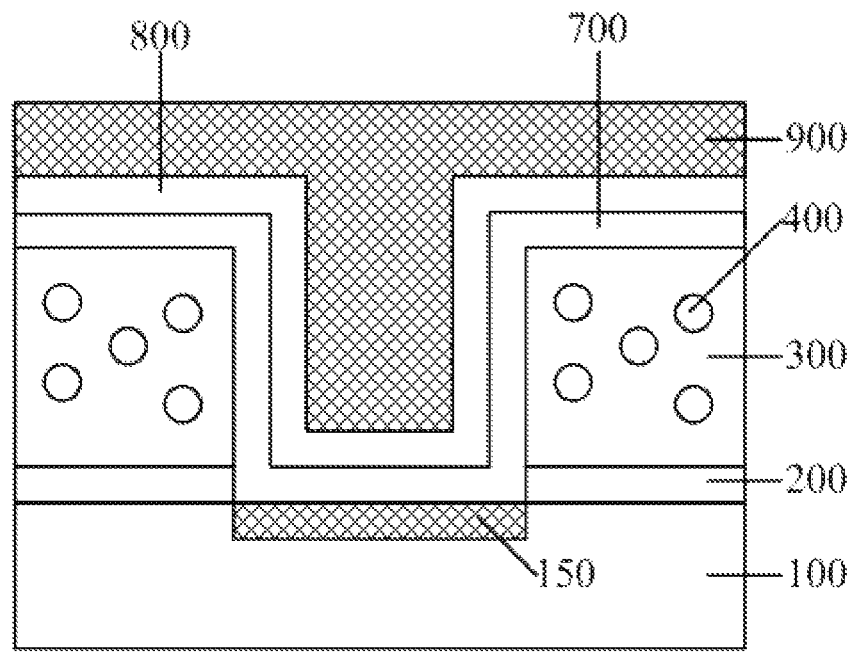
FIG. 6 depicts an exemplary semiconductor device structure after deposition of a metal material in accordance with various disclosed embodiments.

At step S7 in FIG. 1 and referring to FIG. 6, a barrier layer 700 and a seed layer 800 can be formed in the through hole formed in the ILD layer 300 and on the semiconductor substrate 100. The barrier layer 700 can be formed on the entire surface of the device shown in FIG. 3 after removal of the polymer residues 600. Specifically, the barrier layer 700 can be formed on surface of the ILD layer 300 and on bottom and sidewall surfaces of the through hole formed in the ILD layer 300 and the optional etch stop layer 200 and on the semiconductor substrate 100. Once the barrier layer 700 is formed, the seed layer 800 can be formed on the barrier layer 700.

At step S8 in FIG. 1 and still referring to FIG. 6, a metal layer 900 can be formed on the seed layer 800 and in the through hole formed in the ILD layer 300 and the optional etch stop layer 200.

The barrier layer 700 can be made of a material including tantalum, titanium, tantalum nitride, titanium nitride, or any suitable combinations thereof. The barrier layer 700 can have a thickness ranging from about 10 Å to about 100 Å. The barrier layer 700 can be formed by a process including, for example, atomic layer deposition (ALD), physical vapor deposition (PVD), and/or chemical vapor deposition (CVD). The barrier layer 700 can be used to prevent metal in the subsequently formed metal layer 900 from diffusing into the ILD layer 300. The barrier layer 700 can also provide adhesion between the ILD layer 300 and the metal layer 900.

The seed layer 800 can provide a conductive layer or metal seed for subsequently forming the metal layer 900. The seed layer 800 can be made of a material including copper or copper alloy. The seed layer 800 can have a thickness ranging from about 10 Å to about 100 Å. Further, the seed layer 800 can be formed by a process including, for example, sputtering, ALD, PVD, and/or CVD.

The metal layer 900 can be made of a material including, e.g., copper. The metal layer 900 can be formed by, e.g., electro-copper plating (ECP).

Figure 7:
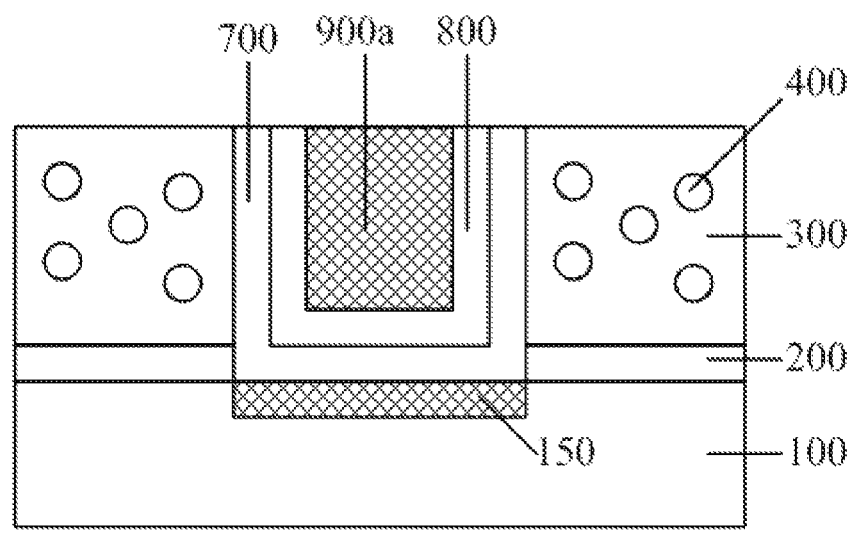
FIG. 7 depicts an exemplary semiconductor device structure after surface planarization in accordance with various disclosed embodiments.

At step S9 in FIG. 1 and referring to FIG. 7, a planarization process can be performed to form a metal plug 900a. For example, a chemical mechanical planarization (CMP) process can be performed to remove portions of each of the barrier layer 700, the seed layer 800, and the metal layer 900, such that the barrier layer 700, the seed layer 800, the metal layer 900, and the ILD layer 300 can be exposed to have a flushed surface. The remaining metal layer can thus form the metal plug 900a.

Note that the metal plug 900a illustrated in FIG. 7 is used as an example of an electrical interconnect structure for illustration purposes. In other embodiments, a surface portion of the metal layer 900 in the through hole can be exposed from the porous ILD layer to provide interconnect wirings. In still other embodiments, any suitable interconnect structures can be formed from the metal layer 900.

Other applications, advantages, alternations, modifications, or equivalents to the disclosed embodiments are obvious to those skilled in the art.

What is claimed is:

1. A cleaning system in a semiconductor processing line for making the semiconductor device, the cleaning system comprising:

a solution supply device for supplying a cleaning solution;

a cleaning chamber connecting to the solution supply device to receive the cleaning solution capable of cleaning the semiconductor device placed in the cleaning chamber, wherein the semiconductor device includes an inter-layer dielectric layer on a semiconductor substrate, and a through-hole passing through the inter-layer dielectric layer to expose a copper layer in the semiconductor substrate, the semiconductor device contains copper ions and photoresist polymer residues, and the cleaning solution in the cleaning chamber is contaminated with the copper ions and the photoresist polymer residues from the semiconductor device; and a solution processing device connecting to the cleaning chamber to receive and process the contaminated cleaning solution to remove the copper ions and the photoresist polymer residues from the contaminated cleaning solution to provide a cleaned solution, wherein the solution processing device is further connected to the solution supply device such that the cleaned solution flows back to the solution supply device for re-use, and the solution processing device includes a filter and an absorption device connected to the filter, the absorption device including polyethylene imine used to absorb the copper ions.

2. The system of claim 1, wherein:
the filter is used to remove the photoresist polymer residues from the contaminated cleaning solution; and
the absorption device is used to remove the copper ions from the contaminated cleaning solution.

3. The system of claim 1, wherein the filter and the absorption device are integrated in a single device of the solution processing device.

4. The system of claim 1, wherein the cleaning system is in the semiconductor processing line after using a photoresist pattern to form the through hole in the inter-layer dielectric (ILD) layer to expose at least a portion of the copper layer in the semiconductor substrate.

5. The system of claim 4, wherein the cleaning system is in the semiconductor processing line before filling the through hole with a metal to form a metal plug or an interconnect wiring on the copper layer through the inter-layer dielectric layer.

6. A cleaning system in a semiconductor processing line for making the semiconductor device, the cleaning system comprising:
a solution supply device for supplying a cleaning solution;
a cleaning chamber connecting to the solution supply device to receive the cleaning solution capable of cleaning the semiconductor device placed in the cleaning chamber,
wherein the semiconductor device includes an inter-layer dielectric layer on a semiconductor substrate, and a through-hole passing through the inter-layer dielectric layer to expose a copper layer in the semiconductor substrate,
the semiconductor device contains copper ions and photoresist polymer residues, and
the cleaning solution in the cleaning chamber is contaminated with the copper ions and the photoresist polymer residues from the semiconductor device;
a solution processing device connecting to the cleaning chamber to receive and process the contaminated cleaning solution to remove the copper ions and the photoresist polymer residues from the contaminated cleaning solution to provide a cleaned solution,
wherein the solution processing device is further connected to the solution supply device such that the cleaned solution flows back to the solution supply device for re-use, and
the solution processing device includes a filter and an ion exchange unit connected to the filter; and
an absorption device, comprising polyethylene imine used to absorb the copper ions and connected to the filter.

7. The system of claim 6, wherein:
the filter is used to remove the photoresist polymer residues from the contaminated cleaning solution; and
the ion exchange unit is used to remove the copper ions from the contaminated cleaning solution by an ion exchange process.

8. The system of claim 6, wherein the ion exchange unit includes an ion exchange resin used to replace the copper ions in the contaminated solution.

9. The system of claim 6, wherein the filter and the ion exchange unit are integrated in a single device of the solution processing device.

10. The system of claim 6, wherein the cleaning system is in the semiconductor processing line after using a photoresist pattern to form the through hole in the inter-layer dielectric (ILD) layer to expose at least a portion of the copper layer in the semiconductor substrate.

11. The system of claim 6, wherein the cleaning system is in the semiconductor processing line before filling the through hole with a metal to form a metal plug or an interconnect wiring on the copper layer through the inter-layer dielectric layer.

* * * * *